(12) United States Patent
Arno et al.

(10) Patent No.: US 9,775,251 B2
(45) Date of Patent: Sep. 26, 2017

(54) DC/DC CONVERTER CONTROL CIRCUIT INCLUDING A PLURALITY OF SERIES-CONNECTED TRANSISTORS AND A CAPACITIVE ELEMENT COUPLING NODES OF THE PLURALITY OF SERIES CONNECTED TRANSISTORS

(71) Applicant: STMICROELECTRONICS INTERNATIONAL N.V., Amsterdam (NL)

(72) Inventors: Patrik Arno, Sassenage (FR); Eric Cirot, Aix en Provence (FR)

(73) Assignee: STMICROELECTRONICS INTERNATIONAL N.V., Amsterdam (NL)

( * ) Notice: Subject to any disclaimer, the term of this patent is extended or adjusted under 35 U.S.C. 154(b) by 0 days.

(21) Appl. No.: 14/957,752

(22) Filed: Dec. 3, 2015

(65) Prior Publication Data

US 2016/0308431 A1    Oct. 20, 2016

(30) Foreign Application Priority Data

Apr. 14, 2015    (FR) .................................... 15 53240

(51) Int. Cl.
*H05K 3/32*    (2006.01)
*H03K 17/16*    (2006.01)
(Continued)

(52) U.S. Cl.
CPC ................ *H05K 3/32* (2013.01); *H02M 1/08* (2013.01); *H02M 3/1588* (2013.01);
(Continued)

(58) Field of Classification Search
CPC .......... H02M 7/483; H02M 2007/4835; H03K 17/687; H01L 29/7816; H01L 27/0629; H03F 3/2173
See application file for complete search history.

(56) References Cited

U.S. PATENT DOCUMENTS 6,559,689 B1 *    5/2003    Clark ................... H03K 17/063
                                                        327/337
2009/0195068 A1    8/2009    Ohashi et al.
(Continued)

OTHER PUBLICATIONS

Svensson et al., "Driving a Capacitive Load Without Dissipating fCV2," IEEE Symposium on Low Power Electronics, 1994, pp. 100-101.
(Continued)

*Primary Examiner* — Jue Zhang
*Assistant Examiner* — Lakaisha Jackson
(74) *Attorney, Agent, or Firm* — Slater Matsil, LLP

(57) ABSTRACT

A circuit is for controlling a power transistor of a DC/DC converter. The circuit may include first and second first transistors coupled in series between a first reference voltage and a control terminal of the power transistor, the first and second transistors defining a first junction node. The circuit may include third and fourth transistors coupled in series between the control terminal and a second reference voltage, the third and fourth transistors defining a second junction node. The first and second transistors may have a first conductivity type different from a second conductivity type of the third and fourth transistors. The circuit may include a capacitive element coupled between the first and second junction nodes.

21 Claims, 3 Drawing Sheets

(51) Int. Cl.
*H02M 1/08* (2006.01)
*H02M 3/158* (2006.01)
H02M 7/483 (2007.01)
H02M 1/00 (2006.01)

(52) U.S. Cl.
CPC .......... *H03K 17/162* (2013.01); *H02M 7/483* (2013.01); *H02M 2001/0054* (2013.01); *H02M 2007/4835* (2013.01); *Y02B 70/1466* (2013.01); *Y02B 70/1491* (2013.01)

(56) References Cited

U.S. PATENT DOCUMENTS

2011/0280052 A1* 11/2011 Al-Haddad ........... H02M 7/483
　　　　　　　　　　　　　　　　　　　　　363/84
2015/0222172 A1* 8/2015 Thakur .................. H02M 1/08
　　　　　　　　　　　　　　　　　　　　　323/311

OTHER PUBLICATIONS

Nowakowski et al., "Choosing the Optimum Switching Frequency of your DC/DC Converter," EE Times, Oct. 25, 2006, pp. 1-7.

* cited by examiner

DC/DC CONVERTER CONTROL CIRCUIT INCLUDING A PLURALITY OF SERIES-CONNECTED TRANSISTORS AND A CAPACITIVE ELEMENT COUPLING NODES OF THE PLURALITY OF SERIES CONNECTED TRANSISTORS

RELATED APPLICATION

This application claims priority to French Patent application No. 15/53240, filed on Apr. 14, 2015, the contents of which are hereby incorporated by reference in their entirety.

TECHNICAL FIELD

The present disclosure generally relates to electronic devices and, more particularly, to direct current/direct current (DC/DC) power converters and to a control circuit for the power converter.

BACKGROUND

In most electronic power conversion circuits, a so-called "power" circuit or stage is used and delivers a relatively high current (in the range from one ampere to a few amperes) to a load. This, for example, concerns power supply circuits, and circuits for controlling power elements from an electronic circuit, etc. The DC/DC power conversion circuits convert a DC reference signal into a DC power signal.

The operation of a DC/DC converter is based on the principle of a switching of a DC power supply voltage, associated with a low-pass filtering. In some applications, the conversion does not necessarily go along with a modification of the value of the voltage with respect to the voltage of the control circuit, but rather with the generation of a current higher than that which can be supplied by the control circuit.

In some applications, two MOS transistors, typically respectively with a P channel and N channel, are series-coupled between two terminals for delivering a DC voltage. These two transistors are called power transistors since they are sized to withstand a relatively high current as compared with the current that the transistors of the control circuit can withstand.

SUMMARY

Generally speaking, a circuit is for controlling a power transistor of a DC/DC converter. The circuit may include first and second first transistors coupled in series between a first reference voltage and a control terminal of the power transistor, the first and second transistors defining a first junction node. The circuit may include third and fourth transistors coupled in series between the control terminal and a second reference voltage, the third and fourth transistors defining a second junction node. The first and second transistors may have a first conductivity type different from a second conductivity type of the third and fourth transistors. The circuit may include a capacitive element coupled between the first and second junction nodes.

DETAILED DESCRIPTION

Figure 1:
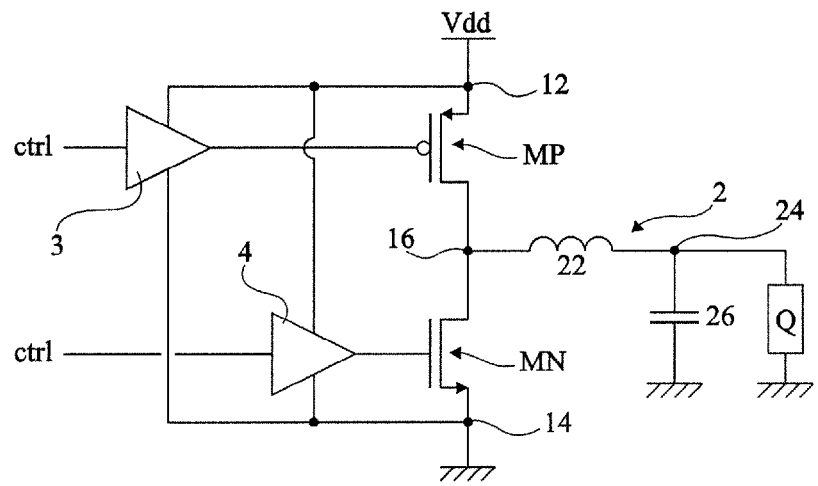
FIG. 1 is a schematic circuit diagram of an example of a DC/DC converter, according to the present disclosure.

The same elements have been designated with the same reference numerals in the different drawings. In particular, the structural and/or functional elements common to the different embodiments may be designated with the same reference numerals and may have identical structural, dimensional, and material properties. For clarity, only those steps and elements which are useful to the understanding of the described embodiments have been shown and will be detailed. In particular, the circuits powered by the DC/DC converter have not been detailed, the described embodiments being compatible with usual applications. In the disclosure, term "coupled" designates a direct connection between two elements, while terms "coupled" and "linked" designate a connection between two elements which may be direct or via one or a plurality of other elements. When reference is made to terms "about", "approximately", or "in the order of", this means to within 10%, preferably to within 5%. The foregoing and other features and advantages will be discussed in detail in the following non-limiting description of specific embodiments in connection with the accompanying drawings.

In the following description, a buck power converter is taken as an example. However, all that will be described more generally applies to any type of power converter operating in switched mode, for example, of boost, buck-boost, flyback, etc. converter type.

Generally speaking, a circuit for controlling a DC/DC converter may comprise at least two transistors of a first type series-coupled between a first terminal of application of a DC voltage and a gate of the main transistor, and at least two transistors of a second type series-coupled between the gate and a second terminal of application of the DC voltage. The circuit may include at least one capacitive element coupling the respective junction points of the transistors of the first type and of the second type.

The transistors of the first and second types may be individually controlled to cause a progressive charge and discharge of the gate of the main transistor. The capacitance of the capacitive element may be at least 5 times, preferably at least 10 times, greater than the gate-source capacitance of the main transistor.

A DC/DC converter may include at least one main transistor, and at least one circuit, such as described hereinabove. The converter may include two main transistors in series between two terminals of application of a DC voltage, and two control circuits, such as described hereinabove.

FIG. 1 shows an example of a DC/DC converter. Two MOS transistors, for example, MP with a P channel and MN with an N channel are series-coupled between two terminals 12 and 14 with application of a DC voltage Vdd. Terminal 14 represents a reference potential, typically, ground. In some applications, voltage Vdd is, for example, in the range from 2 to 10 volts. Junction point 16 of transistors MP and MN is coupled to a low-pass filter 2 for delivering an output voltage to a load Q. The filter 2 generally comprises an inductive element 22 coupling node 16 to an output terminal 24, to which load Q is coupled, and to a capacitive element 26, coupling terminal 24 to terminal 14.

Transistors MP and MN are alternately controlled by control circuits 3 and 4 (drivers) for respectively supplying a current to the inductance from terminal 12 and charging capacitor 26 and sampling the current of inductance 22. Each circuit 3, 4 is generally controlled by a high-frequency pulse train ctrl (from several hundred kHz to a few tens of MHz) and has the function of controlling, at this frequency, the transistor MP or MN, which is associated therewith.

Figure 2:
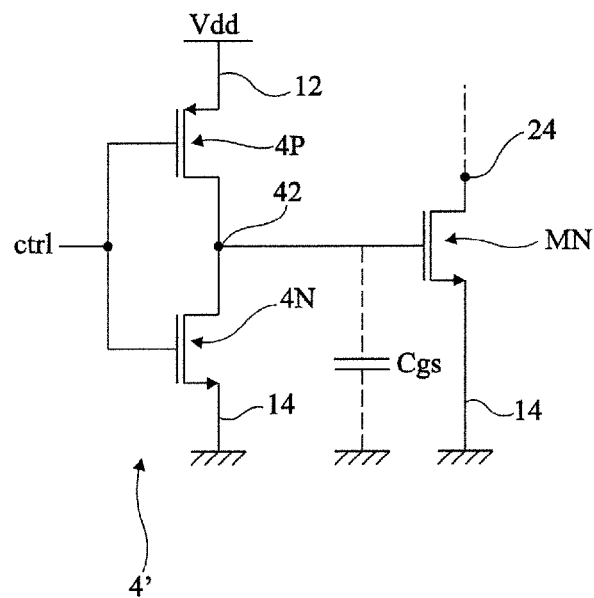
FIG. 2 is a schematic circuit diagram of an example of output stage of a control circuit for a step-down DC/DC converter, according to the present disclosure.

FIG. 2 partially shows an example of a typical control circuit 4' associated with transistor MN. Circuit 4' comprises two MOS transistors 4P and 4N coupled in series between terminals 12 and 14. The two transistors 4P and 4N form either circuit 4', or an output stage thereof. The respective gates of these transistors are coupled together and receive control pulses. Junction point 42 of transistors 4P and 4N defines an output terminal of the control circuit, coupled to the gate of transistor MN. Stage 4' forms a series connection of complementary metal-oxide semiconductor (CMOS) inverters. FIG. 2 shows in dotted lines the stray gate-source capacitance Cgs of power transistor MN. Gate-source capacitance Cgs, which connects, in the case of a buck converter, output 42 of circuit 4' to ground 14, conditions the switching losses of the converter.

Indeed, when transistor 4N is turned on to turn off transistor MN, the energy contained in the gate-source capacitance of transistor MN is discharged towards the ground and dissipated in the on-state resistance of transistor 4N. Similarly, when transistor 4P is turned on to turn on transistor MN by charging its gate, energy is dissipated in the drain-source resistor of transistor 4P in the on state and is lost. Due to the size of transistor MN, such switching losses are not negligible. Further, as the switching frequency increases, the losses also increase. The same phenomenon occurs on the side of transistor MP and its control circuit 3. In other power conversion assemblies, the power transistor controlled by circuit 4' is not grounded. However, a communication loss phenomenon can however be observed.

Figure 3:
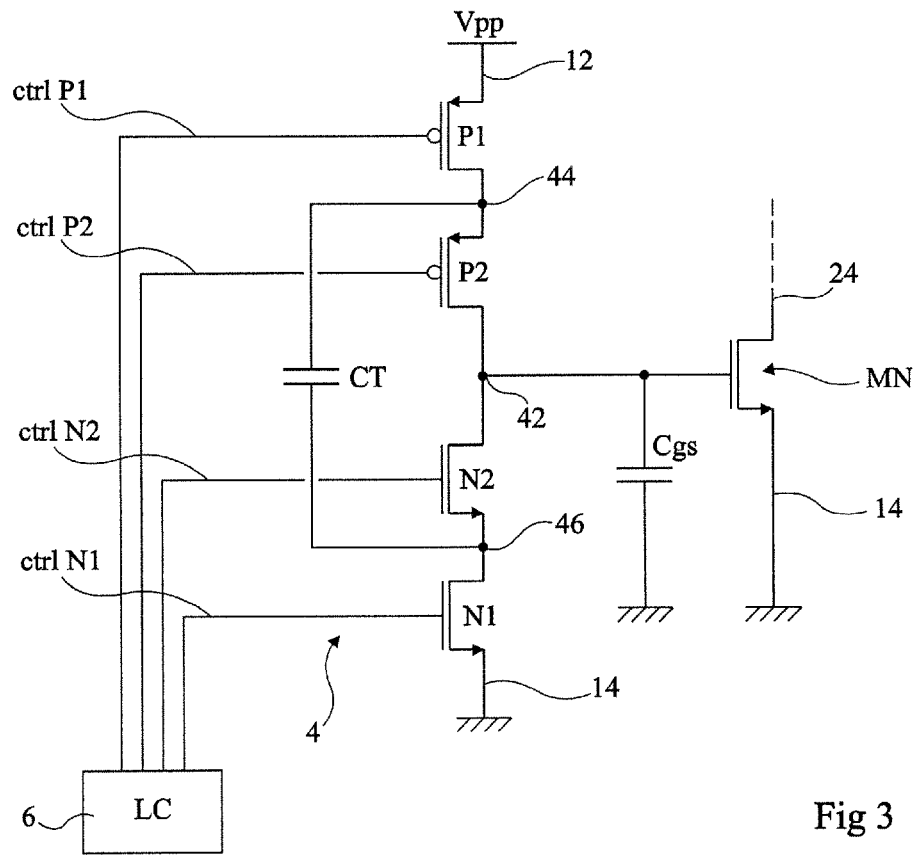
FIG. 3 is a schematic circuit diagram of an embodiment of a control circuit for a DC/DC converter, according to the present disclosure.

FIG. 3 shows an embodiment of a circuit 4 for controlling a MOS power transistor. In the example of FIG. 3, it is assumed that this circuit is control circuit 4 of transistor MN of FIG. 1. According to this embodiment, the output stage of circuit 4 comprises at least two P-channel MOS transistors P1, P2, and at least two N-channel MOS transistors N2, N1, in series between terminals 12 and 14. The junction point of P-channel transistor P2 and N-channel transistor N2 defines an output terminal 42 of circuit 4. Junction point 44 of the two transistors P1 and P2 is coupled, by a capacitive element CT, to junction point 46 of the two transistors N2 and N1. Transistors P1, P2, N1, and N2 are individually controlled by respective digital signals ctrlP1, ctrlP2, ctrlN1, and ctrlN2, different from one another. These signals are generated from control references of the type of signal ctrl (FIG. 2), for example, by a logic circuit 6 (LC) or, for more advanced embodiments, by a microcontroller.

Figure 4:
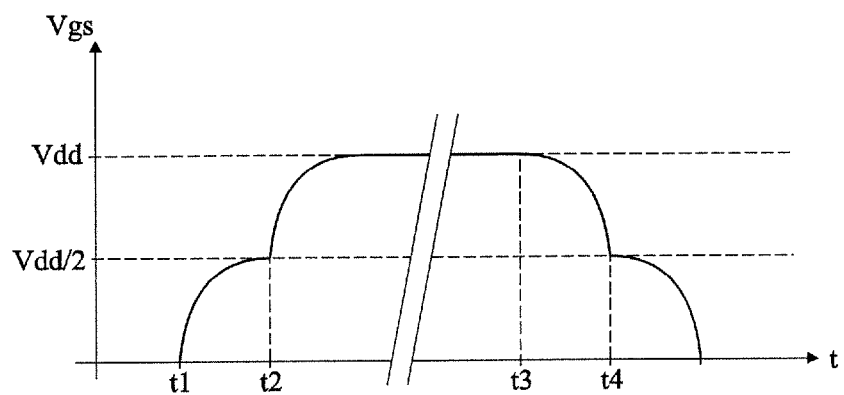
FIG. 4 is a diagram of the operation of the control circuit of FIG. 3.

FIG. 4 illustrates the operation of circuit 4 for the control of transistor MN. This drawing is a timing diagram of gate-source voltage Vgs of transistor MN and illustrates the different turn-on and turn-off phases of transistor MN. In the following description, on-state voltage drops are neglected in the different components. Capacitor CT is assumed to be initially charged, i.e. the circuit is assumed to have already been operational. The voltage across capacitor CT then is approximately Vdd/2.

An initial state where transistors N1 and N2 are on (signals ctrlN1 and signals ctrlN2 in the high state, for example, at level Vdd) while transistors P1 and P2 are off (signals ctrlP1, ctrlP2, ctrlN1, and ctrlN2 in the high state, for example, at level Vdd), is assumed. Node 42 (and thus the gate of transistor MN) then is at 0 volt and transistor MN is off.

At a time t1, transistor N2 is turned off while transistor 22 is turned on (signals ctrlN2 and ctrlP2 at 0 volt). This results in a discharge of capacitor CT in the gate-source capacitance of transistor MN and the potential of node 42 reaches value Vdd/2. The capacitance of capacitor CT is sufficient for the voltage there across not to substantially drop.

At a time t2, transistor 21 is turned on while transistor N1 is turned off (signals ctrlP1 and ctrlN1 at 0 volt). Voltage Vdd of terminal 12 is then applied to node 42, and the gate-source voltage of transistor MN takes value Vdd. At the turning off of transistor MN, a stepped switching technique enabling to recharge capacitor CT for the next cycle is applied.

At a time t3, transistor P2 is turned off while transistor N2 is turned on (signals ctrlP2 and ctrlN2 taken to level Vdd). This results in a discharge of node 42 into capacitor CT so that gate-source voltage Vgs decreases down to value Vdd/2. At a time t4, transistor P1 is turned off while transistor N1 is turned on (signals ctrlP1 and ctrlN1 at level Vdd). Capacitance Cgs then discharges through transistors N2 and N1 while capacitor CT maintains its charge at Vdd/2. The circuit is then ready for a new cycle.

The precharge of node 42 to value Vdd/2 before being taken to level Vdd by the turning-on of transistor P1, and its discharge to value Vdd/2 before being grounded by transistor N1, decrease the converter switching losses, since part of the energy necessary for the switching of the power transistor is recycled in capacitance CT instead of being provided by the circuit power supply. The conduction period of transistor MN is not modified with respect to a usual operation (switching frequency from a few hundred kHz to a few tens of MHz) except that the turn-on and turn-off switching is progressive. The capacitance of capacitor CT should be sufficient for the voltage there across not to drop too much when it transfers part of its charge to the gate of transistor MN. Preferably, a capacitor CT having a capacitance amounting to at least 5 times, preferably at least 10 times, the gate-source capacitance of transistor MN will be selected.

The presence of transistors P2 and N2 and of capacitor CT enables to step the control of transistor MN and thus limits switching losses. A similar circuit is used on the side of transistor MP (circuit 3) to, here again, provide an adiabatic control of transistor MP.

Figure 5:
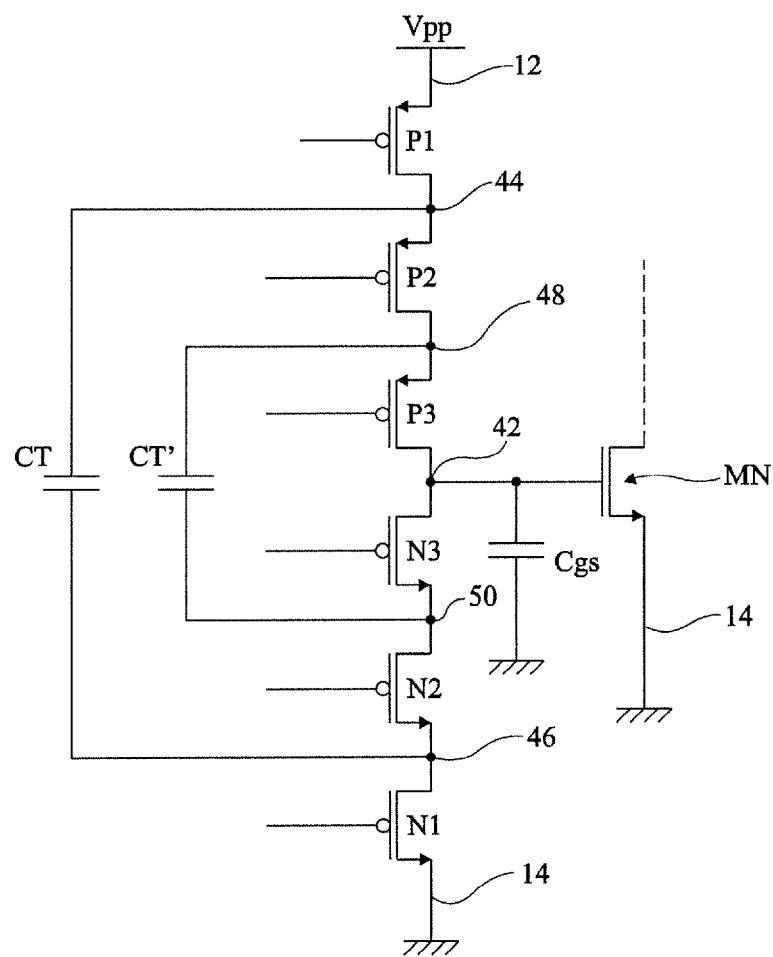
FIG. 5 is a schematic circuit diagram of another embodiment of a control circuit for a DC/DC converter, according to the present disclosure.

FIG. 5 shows another embodiment where three P-channel transistors P1 to P3 and three N-channel transistors N1 to N3 are provided. Apart from capacitor CT coupling nodes 44 (between transistors P1 and P2) and 46 (between transistors N1 and N2), a capacitor CT' connects nodes 48 (between transistors P2 and P3) and 50 (between transistors N3 and N2), node 42 corresponding to the junction point of transistors P3 and N3. Considering capacitors CT and CT' of same capacitance, the voltages there across alternately take values Vdd/3 and 2Vdd/3.

An advantage of the embodiments which have been described is that they decrease switching losses, part of the energy stored in the gate of the power transistors being reused. Another advantage is that the control of the transistors of the control circuit is compatible with a digital control (0-Vdd) and does not require generating intermediate potentials.

Various embodiments have been described. Various alterations, modifications, and improvements will occur to those skilled in the art. In particular, the number of transistors of the multiple-level control circuit depends on the application and on a trade-off between the level acceptable for switching losses and the circuit surface area. Also, as the number of levels increases, the switching losses are reduced. A number of transistors in the range from 4 to 10 forms, in most cases, an acceptable approach.

Further, although the described embodiments take a buck converter as an example, the principle more generally applies to any switching of a power transistor. Further, the practical implementation of the embodiments which have been described is within the abilities of those skilled in the art based on the functional indications given hereinabove. In particular, the programming of the microcontroller for generating the control signals of the transistors of the multiple-level control circuit is within the abilities of those skilled in the art.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

That which is claimed is:

1. A circuit for controlling a power transistor of a direct current/direct current (DC/DC) converter, the circuit comprising:
    first and second transistors coupled in series between a first reference voltage and a control terminal of the power transistor, said first and second transistors defining a first junction node therebetween;
    third and fourth transistors coupled in series between the control terminal and a second reference voltage, said third and fourth transistors defining a second junction node therebetween, wherein a source terminal of the second transistor is coupled with a drain terminal of the third transistor to form an output junction node, the output junction node being configured to drive the control terminal of the power transistor;
    said first and second transistors having a first conductivity type different from a second conductivity type of said third and fourth transistors; and
    a capacitive element coupled between the first and second junction nodes.

2. The circuit of claim 1 wherein said first transistor, second transistor, said third transistor, and said fourth transistor are each individually controlled to cause a progressive charge and discharge of the control terminal of the power transistor.

3. The circuit of claim 1 wherein a capacitance of said capacitive element is at least 5 times greater than a control terminal-conductive terminal capacitance of the power transistor.

4. The circuit of claim 1 wherein a capacitance of said at least one capacitive element is at least 10 times greater than a control terminal-conductive terminal capacitance of the power transistor.

5. The circuit of claim 1 further comprising a logic circuit; and wherein said first transistor, second transistor, said third transistor, and said fourth transistor each comprises a control terminal coupled to said logic circuit.

6. The circuit of claim 1 further comprising at least one additional first conductivity type transistor coupled in series with said first and second transistors and defining at least one additional first junction node, and at least one additional second conductivity type transistor coupled in series with said third and fourth transistors and defining at least one additional second junction node.

7. The circuit of claim 6 further comprising at least one additional capacitive element coupled between the at least one additional first junction node and the at least one additional second junction node.

8. A direct current/direct current (DC/DC) converter comprising:
    at least one power transistor; and
    at least one control circuit coupled to said at least one power transistor and comprising
        first and second transistors coupled in series between a first reference voltage and a control terminal of the power transistor, said first and second transistors defining a first junction node therebetween,
        third and fourth transistors coupled in series between the control terminal and a second reference voltage, said third and fourth transistors defining a second junction node therebetween, wherein the second transistor is coupled in series with the third transistor to form an output junction node, the output junction node being configured to drive the control terminal of the power transistor,
        said first and second transistors having a first conductivity type different from a second conductivity type of said third and fourth transistors, and
        a capacitive element coupled between the first and second junction nodes.

9. The DC/DC converter of claim 8 wherein said first transistor, second transistor, said third transistor, and said fourth transistor are each individually controlled to cause a progressive charge and discharge of the control terminal of the power transistor.

10. The DC/DC converter of claim 8 wherein a capacitance of said capacitive element is at least 5 times greater than a control terminal-conductive terminal capacitance of the power transistor.

11. The DC/DC converter of claim 8 wherein a capacitance of said at least one capacitive element is at least 10 times greater than a control terminal-conductive terminal capacitance of the power transistor.

12. The DC/DC converter of claim 8 wherein said at least one control circuit comprises a logic circuit; and wherein said first transistor, second transistor, said third transistor, and said fourth transistor each comprises a control terminal coupled to said logic circuit.

13. The DC/DC converter of claim 8 wherein said at least one control circuit comprises at least one additional first conductivity type transistor coupled in series with said first and second transistors and defining at least one additional first junction node, and at least one additional second conductivity type transistor coupled in series with said third and fourth transistors and defining at least one additional second junction node.

14. The DC/DC converter of claim 13 further comprising at least one additional capacitive element coupled between the at least one additional first junction node and the at least one additional second junction node.

15. A method for making a circuit for controlling a power transistor of a direct current/direct current (DC/DC) converter, the method comprising:
  coupling first and second transistors in series between a first reference voltage and a control terminal of the power transistor, the first and second transistors defining a first junction node therebetween;
  coupling third and fourth transistors in series between the control terminal and a second reference voltage, the third and fourth transistors defining a second junction node therebetween, the second transistor and the third transistor defining an output junction node therebetween, the output junction node being configured to drive the control terminal of the power transistor;
  the first and second transistors having a first conductivity type different from a second conductivity type of the third and fourth transistors; and
  coupling a capacitive element between the first and second junction nodes.

16. The method of claim 15 wherein the first transistor, second transistor, the third transistor, and the fourth transistor are each individually controlled to cause a progressive charge and discharge of the control terminal of the power transistor.

17. The method of claim 15 wherein a capacitance of the capacitive element is at least 5 times greater than a control terminal-conductive terminal capacitance of the power transistor.

18. The method of claim 15 wherein a capacitance of the at least one capacitive element is at least 10 times greater than a control terminal-conductive terminal capacitance of the power transistor.

19. The method of claim 15 further comprising a logic circuit; and wherein the first transistor, second transistor, the third transistor, and the fourth transistor each comprises a control terminal coupled to the logic circuit.

20. The method of claim 15 further comprising coupling at least one additional first conductivity type transistor in series with the first and second transistors and defining at least one additional first junction node, and coupling at least one additional second conductivity type transistor in series with the third and fourth transistors and defining at least one additional second junction node.

21. The method of claim 20 further comprising coupling at least one additional capacitive element between the at least one additional first junction node and the at least one additional second junction node.

* * * * *